United States Patent [19]

Kim

[11] Patent Number: 4,978,630
[45] Date of Patent: Dec. 18, 1990

[54] FABRICATION METHOD OF BIPOLAR TRANSISTOR

[75] Inventor: Myung S. Kim, Seoul, Rep. of Korea

[73] Assignee: Samsung Semiconductor & Telecommunication Co., Ltd., Kyungsang Buk-do, Rep. of Korea

[21] Appl. No.: 249,310

[22] Filed: Sep. 26, 1988

[30] Foreign Application Priority Data

Sep. 26, 1987 [KR] Rep. of Korea .................... 87-10712

[51] Int. Cl.$^5$ .......................................... H01L 21/20
[52] U.S. Cl. ....................................... 437/32; 437/31; 437/162; 437/193; 437/917; 148/DIG. 10; 148/DIG. 96
[58] Field of Search ................. 437/32, 917, 162, 31, 437/33, 193; 148/DIG. 10, DIG. 11, DIG. 96; 357/34, 35, 59 H

[56] References Cited

U.S. PATENT DOCUMENTS

| | | |
|---|---|---|
| 3,915,767 | 10/1975 | Welliver ............................... 437/162 |
| 4,577,397 | 3/1986 | Komatsu et al. ...................... 437/32 |
| 4,669,177 | 6/1987 | D'Arrigo et al. ..................... 357/35 |
| 4,682,409 | 7/1987 | Thomas et al. ...................... 437/200 |
| 4,707,720 | 11/1987 | Shirai et al. ........................ 357/23.8 |
| 4,721,685 | 1/1988 | Lindenfelser et al. ................ 357/34 |
| 4,755,476 | 7/1988 | Bohm et al. .......................... 437/191 |
| 4,769,337 | 9/1988 | Maeda .................................. 437/31 |

FOREIGN PATENT DOCUMENTS

| | | | |
|---|---|---|---|
| 0161067 | 9/1984 | Japan ................................... 437/162 |
| 0207659 | 11/1984 | Japan ................................... 437/31 |
| 0293767 | 12/1987 | Japan ................................... 357/35 |

Primary Examiner—Brian E. Hearn
Assistant Examiner—Tuan Nguyen
Attorney, Agent, or Firm—Cushman, Darby & Cushman

[57] ABSTRACT

Present invention relates to the fabrication method of the bipolar transistor which includes NPN transistor and field-plate lateral PNP transistor.

The arsenic implanted polycrystalline silicon is used for the emitter electrode of NPN transistor to increase the current gain, and for the field-plate of the lateral PNP transistor to reduce the collector-emitter leakage current.

Also, this polycrystalline silicon is used for the ion implanting mask for the extrinsic base of the NPN transistor and for the emitter, collector of the lateral PNP transistor simultaneously.

Therefore, the extrinisc base of NPN transistor and the emitter, collector of the lateral PNP transistor are self-aligned by the polycrystalline silicon, and so one mask is saved by this method.

11 Claims, 7 Drawing Sheets

FABRICATION METHOD OF BIPOLAR TRANSISTOR

BACKGROUND OF THE INVENTION

1. Field of the Invention

The present invention is related to the fabrication method of the bipolar transistor and is especially related to the fabrication method of the self-aligned NPN transistor and the self-aligned lateral PNP transistor having a field plate.

2. Description of the Prior Art

In the fabrication of a lateral PNP transistor, the epitaxial layer serves as the base region.

During the process, the surface of this epitaxial layer is likely to be weakly inverted of p-type or to be depleted, by the autodoping of boron ions and other contaminations.

This problem is severe especially in case that the resistivity of the epitaxial layer is high.

This surface inversion induces the collector-emitter leakage current of the lateral PNP transistor, so the device performance is degraded.

To prevent this surface inversion, the metal field plate overlapped on the epitaxial base region has been used conventionally.

In that case, the emitter metal overlaps over the base region and serves the field plate.

Figure 1:
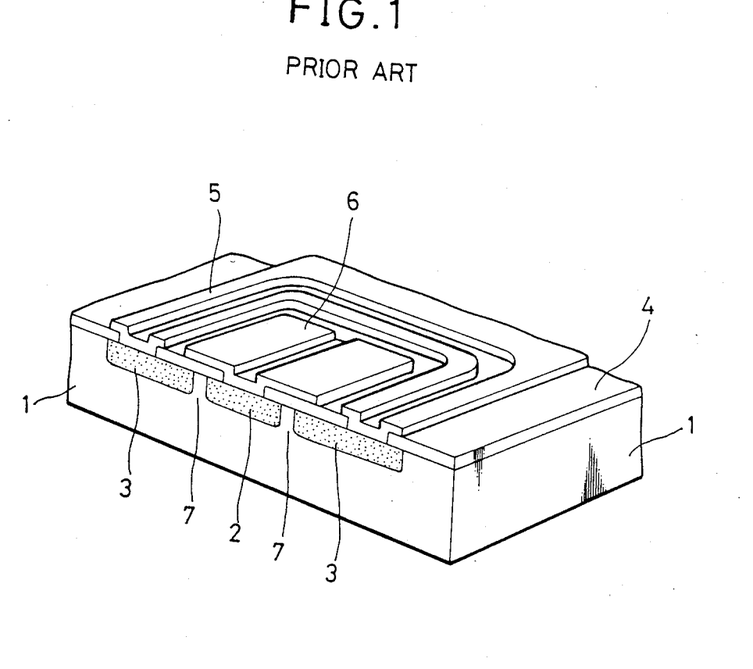
FIG. 1 is a schematic diagram of the conventional lateral PNP bipolar transistor.

FIG. 1 is the sectional view of the conventional lateral PNP transistor with a metal field plate.

As shown in FIG. 1, p-type emitter 2 and p-type collector 3 are formed on n-type epitaxial layer 1 which serves as the base of lateral PNP.

The emitter contact metal 6 overlaps the base region 7 of lateral PNP transistor to form a metal field plate.

This metal plate prevents the surface inversion in base region of lateral PNP transistor, and reduces the collector-emitter leakage current because the emitter is biased higher than the base, collector in normal operation.

However, this structure has some handicaps.

The device area is increased because of a metal spacing.

Also, the emitter bias voltage has to be high for prevention of the surface inversion because the oxide thickness under the metal field plate is thick.

SUMMARY OF THE INVENTION

The object of the present invention is to provide the fabrication method of the bipolar transistor which has the field plate without any increase in the area of the devices and the low emitter bias voltage is sufficient for prevention of the surface inversion.

Another object of the present invention is to provide the fabrication method of the semiconductor devices which can fabricate the self-aligned, high-speed, high-performance, high-integrated NPN transistor and the lateral PNP transistor simultaneously.

DETAILED DESCRIPTION OF THE INVENTION

Hereinafter the present invention is described in detail with figures appended.

FIGS. 2A to I are the fabrication process diagrams of an example according to the present invention. The starting material is the p-type single-crystalline silicon substrate, whose resistivity is 10 to 20 $\Omega$-Cm and the crystal orientation (100).

Figure 2:
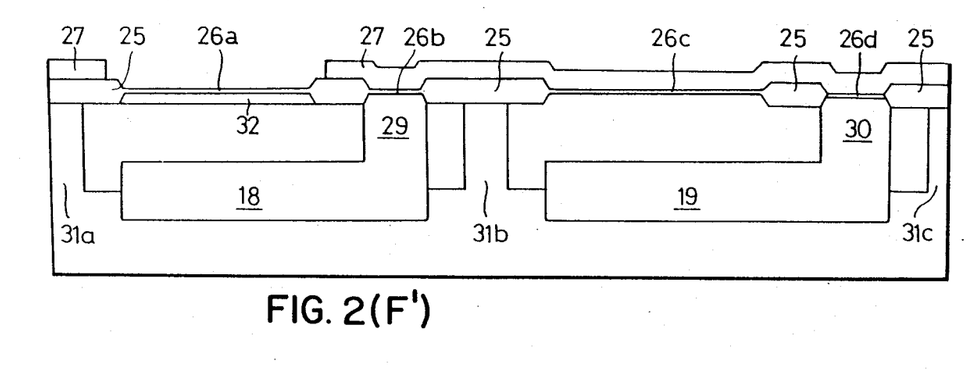
FIGS. 2A to I are the fabrication process diagrams according to the present invention.
Figure 2A:
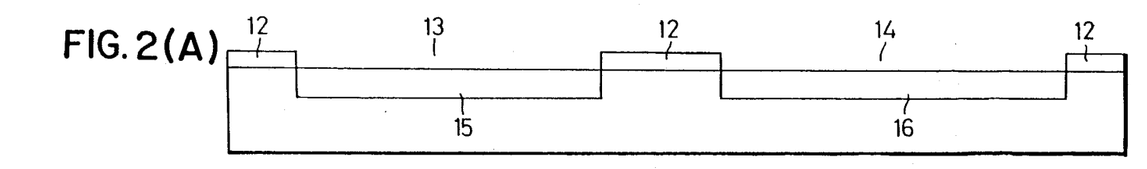

After the 1st oxide layer 12 of 6000 to 8000 Å for the masking is grown on the substrate 11, the photoresist is put on the oxide layer 12 as shown in FIG. 2A. And then, after the windows 13 and 14 for the 1st buried layer for the NPN transistor and the 2nd buried layer for the lateral PNP transistor are formed by the conventional photolithographic process, the photoresist is removed and the arsenic ions are implanted and activated by annealing. And so the 1st and the 2nd n+ regions 15, 16 are formed.

Figure 2B:
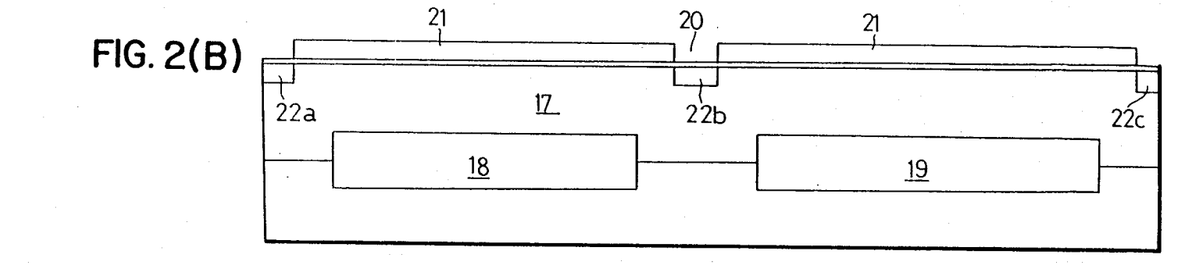

And then, after the oxide layer 12 is completely removed, the n-type epitaxial layer 17 is grown on the substrate 11 as in FIG. 2B.

The 1st and the 2nd buried layers 15 and 16 are out diffused upon the substrate 11 when the epitaxial layer 17 is grown up. As the result the 1st and the 2nd buried layers 18 and 19 are formed.

And then, after the 2nd oxide layer 20 is grown on the epitaxial layer 17 by a conventional oxidation process and the photoresist 21 is put on to form the device isolation region by a conventional photolithographic process, boron ions are implanted to form the p-type regions 22a, 22b and 22c as in FIG. 2B.

And then, the photoresist 21 is removed and the nitride layer, Si3N4, of 1000 to 2000 Å is deposited on the 2nd oxide layer 20 by CVD(Chemical Vapor Deposition).

Figure 2C:
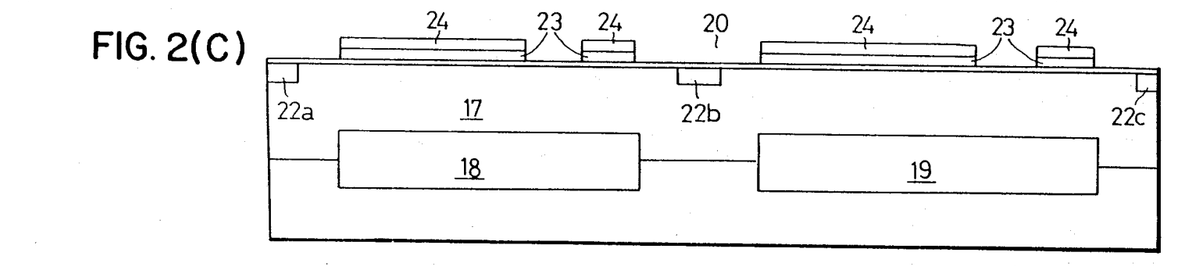

The photoresist 24 is put on the entire substrate, and the nitride layer 23 for non-active region of the device is etched by a conventional photolithographic and etching process as shown in FIG. 2C.

Figure 2D:
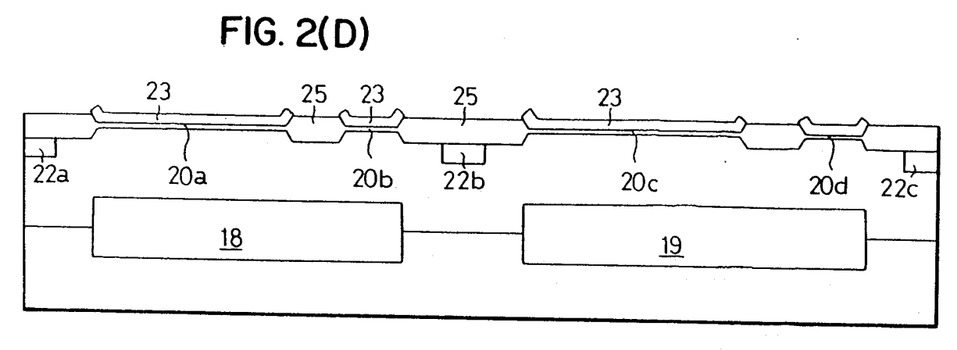

And then, after the photoresist 24 is removed and the field oxide layer 25 of about 6000 to 10000 Å is grown as shown in FIG. 2D, the nitride layer 23 is removed.

And then, the 2nd oxide layers 20a, 20b, 20c and 20d under the nitride layer 23 are etched, the 3rd oxide layers 26a, 26b, 26c and 26d of about 300 to 600 Å are grown by a conventional oxidation process.

Figure 2E:
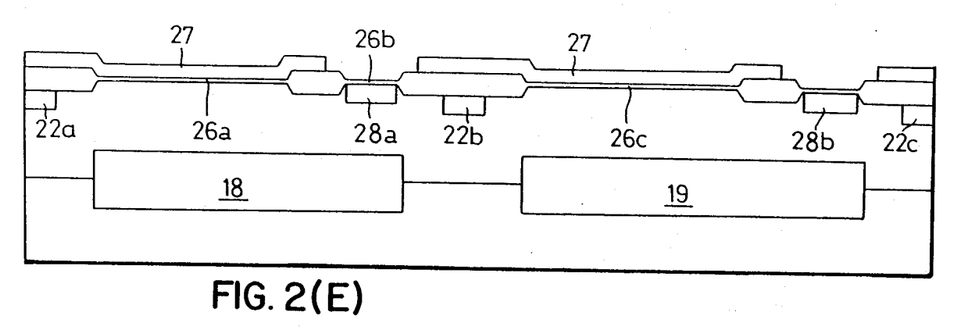

And then, the photoresist 27 is put on to form n+ sink region by a conventional photolithographic process and the phosphorous ions are implanted to form the n-type region 28a, 28b as shown in FIG. 2E.

And then, the photoresist 27 is removed.

Figure 2F:
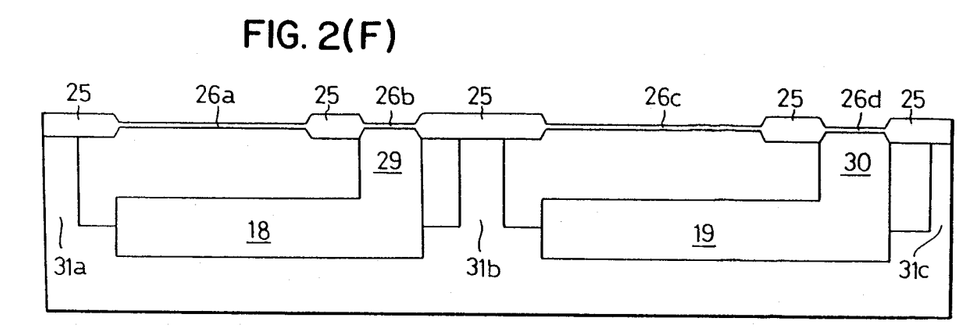

The device isolation regions 31a, 31b and 31c and the 1st and the 2nd n+ sink regions 29 and 30 are formed by the conventional diffusion process as shown in FIG. 2F.

And then, the photoresist 27' is put on to form the intrinsic base region of a NPN transistor by a conventional process as shown in FIG. 2F'.

And then, after boron ions are implanted with 40 Kev energy and $7 \times 10^{13}$ ions/Cm$^2$ dose through the oxide layer 26a, the photoresist layer 27' is removed. And then, for the 900° C., 30 min. annealing is proceeded to form the intrinsic base region 32 as shown in FIG. 2G.

Figure 2G:
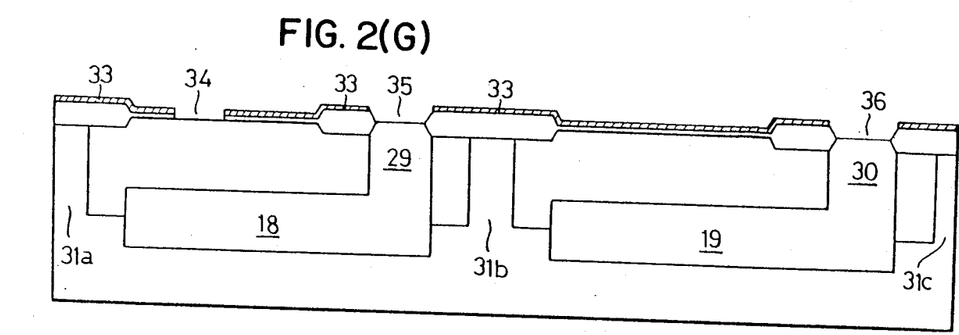

And then, after the nitride layer 33, Si3N4, of 600 to 1000 Å is deposited on the entire substrate by a low pressure CVD(Chemical Vapor Deposition) process, the emitter contact window 34 and the collector contact window 35 of the NPN transistor and the base contact window 36 of the lateral PNP transistor are opened by a conventional photolithography and etching process as shown in FIG. 2G.

And then, the polycrystalline silicon layer 37' for the formation of the emitter of the NPN transistor and the field plate of the lateral PNP transistor is deposited on the entire substrate, and the arsenic ions are implanted into the polycrystalline silicon layer 37' with proper energy and $9 \times 10^{15}$ ions/Cm$^2$ dose as shown in FIG. 2G'.

Figure 2H:
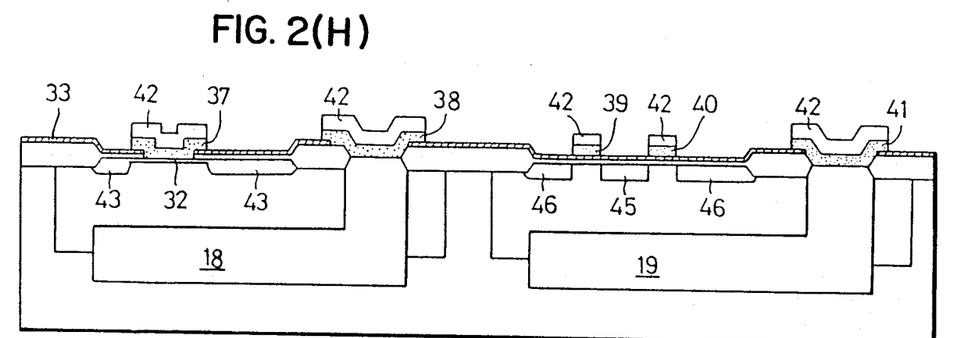

And then, the photoresist 42 is put on the entire substrate and the polycrystalline silicon layer 37' is etched by a conventional photolithography and etching process. At this time, the emitter electrode 37, collector electrode 38 of a NPN transistor and the field plate 39, 40, the base electrode of a lateral PNP transistor are formed as shown in FIG. 2H.

To form the p-type region, the boron ions are implanted with a $3 \sim 5 \times 10^{15}$ ions/Cm$^2$ and a proper high energy enough to penetrate the double layer of the nitride layer 33 and the oxide layer 26c.

At this time, the polycrystalline silicon emitter electrode 37 of the NPN transistor plays a role of the self-align mask of the extrinsic base, and the polycrystalline silicon field plate 39 and 40 of the lateral PNP transistor plays a role of the self-align mask of the emitter 45 and the collector 46 of the lateral PNP transistor.

And then the photoresist 42 is removed.

The oxide layer 48 of about 3000 to 5000 Å is deposited by a conventional CVD process, and the annealing process is proceeded in temperature of about 900° to 1100° C. for 20 to 30 minutes to diffuse the ion-implanted region. At this time, the n+ emitter region 49, p+ extrinsic base region 43 of NPN transistor and the emitter region 45, collector region 46 of the lateral PNP transistor are formed simultaneously.

And then, the contact windows for each diffusion regions are opened by a conventional photolithography and etching process as shown in FIG. 2H'.

At this time, the emitter contact window of the lateral PNP transistor is overlapped on the polycrystalline silicon field plate 40 to connect with a metal.

Figure 2I:
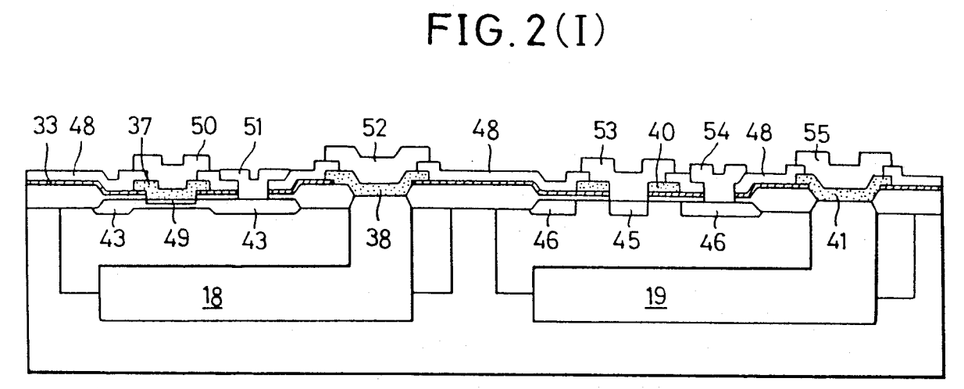

In final step as shown in FIG. 2I, by a conventional process, a metallization layer is added to the device to establish electrical connections to the emitter, the base, the collector electrodes 50, 51, 52 of the NPN transistor and the emitter, the collector, the base electrodes 53, 54, 55 of the lateral PNP transistor.

As above, the electrical potential of the polycrystalline silicon field plate is same to the emitter of the lateral PNP transistor because the emitter contact is overlapped on the field plate. Accordingly, the surface inversion does not occur in the base region of the lateral PNP transistor.

As mentioned above, the present invention can prevent the collector-emitter leakage current of lateral PNP transistor by adapting the polycrystalline silicon field plate. In comparing with the conventional lateral PNP transistor having a metal field plate, the present invention reduces the device area because the emitter, collector regions are self-aligned by the field plate. Also, a small emitter bias voltage is enough to supress a surface inversion, because the layer thickness under the field plate is thinner than that under the conventional metal field plate.

Also, the n+ polycrystalline silicon emitter of the NPN transistor improves the current gain and device performance.

Another advantage of the present invention is that the extrinsic base is self-aligned by n+ polycrystalline silicon, so one mask is saved.

I claim:

1. A method for fabricating a lateral PNP transistor including a field plate, comprising the steps of:

forming a base region on a substrate;

forming a doped polycrystalline silicon layer over the substrate; etching said polycrystalline silicon layer to form a base electrode made of polycrystalline silicon and contacting said base region, and to form said field plate from polycrystalline silicon;

using said polycrystalline silicon field plate as a mask, forming an emitter and a collector region for said lateral PNP transistor on the substrate by ion implantation, whereby the use of said polycrystalline silicon field plate as a mask permits the formation of the emitter and collector regions without an additional mask and etching step; depositing an oxide layer over the substrate;

annealing said ion implanted emitter and collector diffusion regions subsequent to deposition of said oxide layer;

opening respective contact windows in said oxide layer for the emitter region, the collector region, and the base electrode; and forming metal contacts within respective windows for said emitter region, said collector region, and said base electrode; said contact window of said emitter region overlaps said polycrystalline silicon field plate, whereby the metal contact in said emitter contact window contacts said field plate.

2. A method as recited in claim 1, further comprising the step of:

prior to depositing said polycrystalline silicon layer, depositing a nitride layer over the substrate and etching said nitride layer to form a base contact window therein for contacting said base region of said lateral PNP transistor.

3. A method as recited in claim 2, wherein:

said emitter and collector regions of said PNP transistor are ion implanted with boron ions.

4. A method as recited in claim 1, wherein:

said substrate is n-type silicon.

5. A method as recited in claim 4, wherein:

said emitter and collector regions of said PNP transistor are ion implanted with boron ions.

6. A method as recited in claim 1, wherein an NPN transistor is simultaneously formed on said substrate, further comprising the steps of:

providing separate regions on said substrate for said lateral PNP transistor and said NPN transistor;

forming a collector region on said substrate for said NPN transistor;

forming an intrinsic base region in said substrate for said NPN transistor by ion implantation;

etching said polycrystalline silicon layer to form an emitter electrode made of polycrystalline silicon for said NPN transistor;

using said polycrystalline silicon emitter electrode as a mask, forming an extrinsic base region in said substrate by ion implantation, simultaneously with the ion implantation of said emitter and collector regions of said lateral PNP transistor;

annealing to diffuse said emitter and extrinsic base regions of said NPN transistor simultaneously with the annealing of said emitter and collector regions of said lateral PNP transistor;

opening respective contact windows in said oxide layer for diffused regions of the NPN transistor; and forming metal contacts within each said contact window of said NPN transistor.

7. A method as recited in claim 6, further comprising the step of:

prior to depositing said polycrystalline silicon layer, depositing a nitride layer over the substrate, and etching said nitride layer to form a base contact window for the lateral PNP transistor, and an emitter contact window and a collector contact window for the NPN transistor.

8. A method as recited in claim 6, wherein: said polycrystalline silicon layer is also etched to form a collector electrode made of polycrystalline silicon for said NPN transistor.

9. A method as recited in claim 6, wherein:

during ion implantation of said extrinsic base region of the NPN transistor and said emitter and collector regions of the lateral PNP transistor, said emitter electrode of the NPN transistor and said field plate of the lateral PNP transistor are covered by a layer of photoresist, whereby each said mask includes a layer of polycrystalline silicon and a layer of photoresist.

10. A method as recited in claim 9, wherein:

said substrate is n-type silicon; and said extrinsic base region of the NPN transistor and said emitter and collection regions of said PNP transistor are ion implanted with boron ions.

11. A method as recited in claim 6, wherein:

said substrate is n-type silicon; and said extrinsic base region of the NPN transistor and said emitter and collector regions of said PNP transistor are ion implanted with boron ions.

* * * * *